United States Patent
Lee

(10) Patent No.: US 10,170,023 B2
(45) Date of Patent: Jan. 1, 2019

(54) TRANSPARENT ELECTRONIC DISPLAY BOARD AND METHOD FOR MANUFACTURING SAME

(71) Applicant: G-SMATT CO., LTD., Gyeonggi-do (KR)

(72) Inventor: Ho Jun Lee, Seoul (KR)

(73) Assignee: G-SMATT CO., LTD., Gyeonggi-do (KR)

( * ) Notice: Subject to any disclaimer, the term of this patent is extended or adjusted under 35 U.S.C. 154(b) by 0 days.

(21) Appl. No.: 14/415,723

(22) PCT Filed: Nov. 27, 2012

(86) PCT No.: PCT/KR2012/010103
§ 371 (c)(1),
(2) Date: Jan. 19, 2015

(87) PCT Pub. No.: WO2014/014169
PCT Pub. Date: Jan. 23, 2014

(65) Prior Publication Data
US 2015/0235578 A1  Aug. 20, 2015

(30) Foreign Application Priority Data
Jul. 18, 2012 (KR) .................. 10-2012-0078116

(51) Int. Cl.
*G09F 13/22* (2006.01)
*H05B 33/06* (2006.01)
*H05B 33/10* (2006.01)

(52) U.S. Cl.
CPC ............ *G09F 13/22* (2013.01); *H05B 33/06* (2013.01); *H05B 33/10* (2013.01); *G09F 2013/222* (2013.01); *Y10T 156/1064* (2015.01)

(58) Field of Classification Search
CPC ......... G09F 13/22; G09F 2001/134318; G09F 1/134309; H05B 33/26; H05B 33/28
See application file for complete search history.

(56) References Cited

U.S. PATENT DOCUMENTS 5,691,738 A * 11/1997 Arai ................. H05B 33/06
345/76
7,498,733 B2 * 3/2009 Shimoda ............ H01L 27/3244
313/500

(Continued)

FOREIGN PATENT DOCUMENTS

| KR | 10-2002-0016493 A | 3/2002 |
| KR | 10-2006-0007270 A | 1/2006 |
| KR | 10-2012-0009118 A | 2/2012 |

OTHER PUBLICATIONS

International Search Report for PCT/KR2012/010103.

*Primary Examiner* — Charles A Fox
*Assistant Examiner* — Christopher E Veraa
(74) *Attorney, Agent, or Firm* — The PL Law Group, PLLC

(57) ABSTRACT

Disclosed herein are a transparent electronic display board and a method for manufacturing the same. The transparent electronic display board displays text, images, or videos by means of switching on or off a plurality of light emitting elements installed on transparent electrodes. The transparent electronic display board is configured such that wiring of the light emitting elements is effectively formed. Therefore, the number of assembly processes and the level of difficulty in manufacture thereof can be reduced, allowing for improved productivity.

5 Claims, 7 Drawing Sheets

(56) References Cited

U.S. PATENT DOCUMENTS

| | | | |
|---|---|---|---|
| 8,058,653 B2* | 11/2011 | Lee | H01L 27/124 |
| | | | 257/72 |
| 8,426,846 B2* | 4/2013 | Tanaka | H05B 33/14 |
| | | | 257/101 |
| 2005/0053801 A1* | 3/2005 | Elschner | H01L 51/0037 |
| | | | 428/690 |
| 2008/0225523 A1* | 9/2008 | De Samber | F21K 9/00 |
| | | | 362/249.01 |
| 2011/0186846 A1* | 8/2011 | Ha | H01L 27/326 |
| | | | 257/59 |
| 2011/0199554 A1* | 8/2011 | Isami | G02F 1/13452 |
| | | | 349/58 |

* cited by examiner

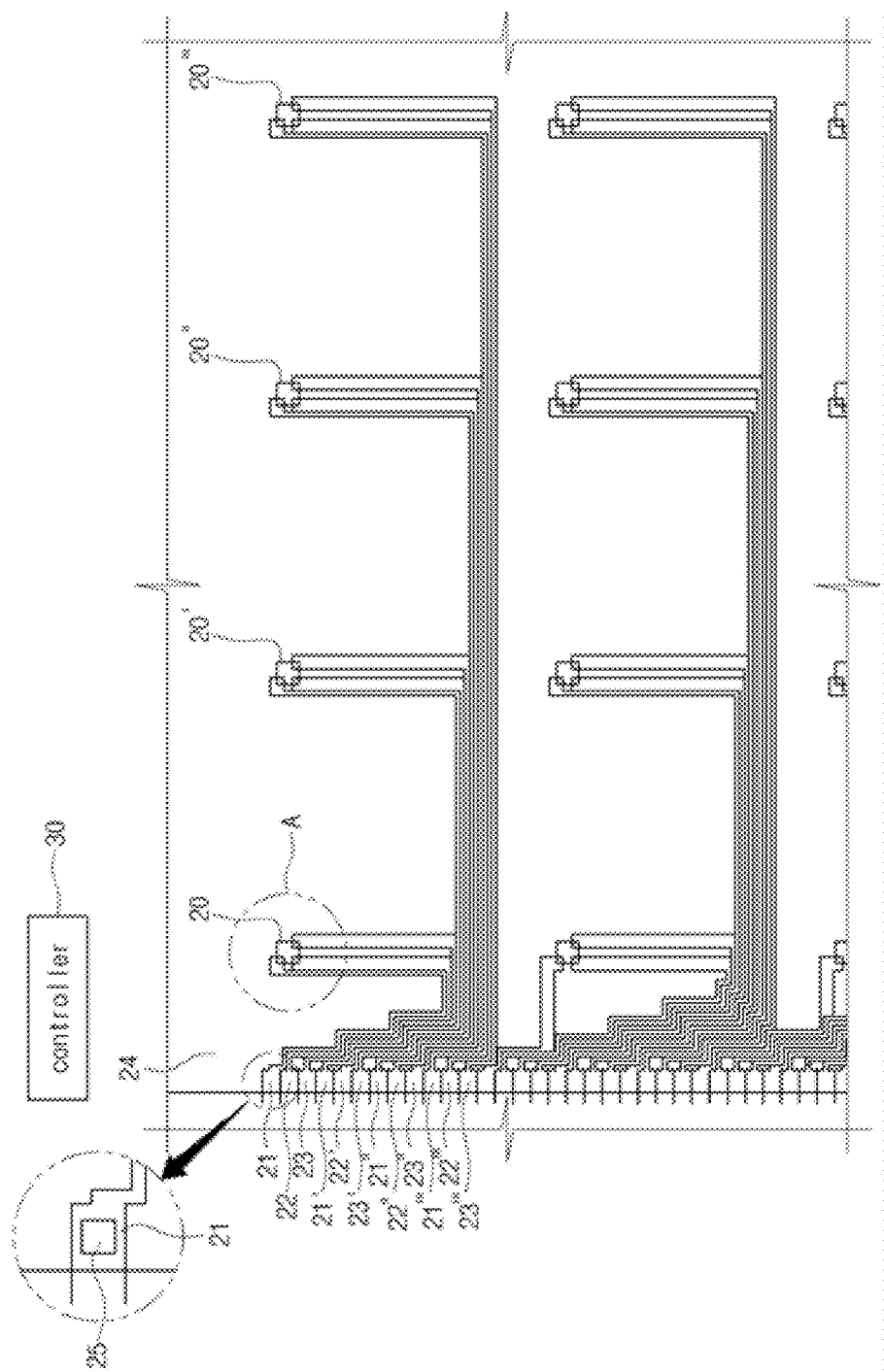

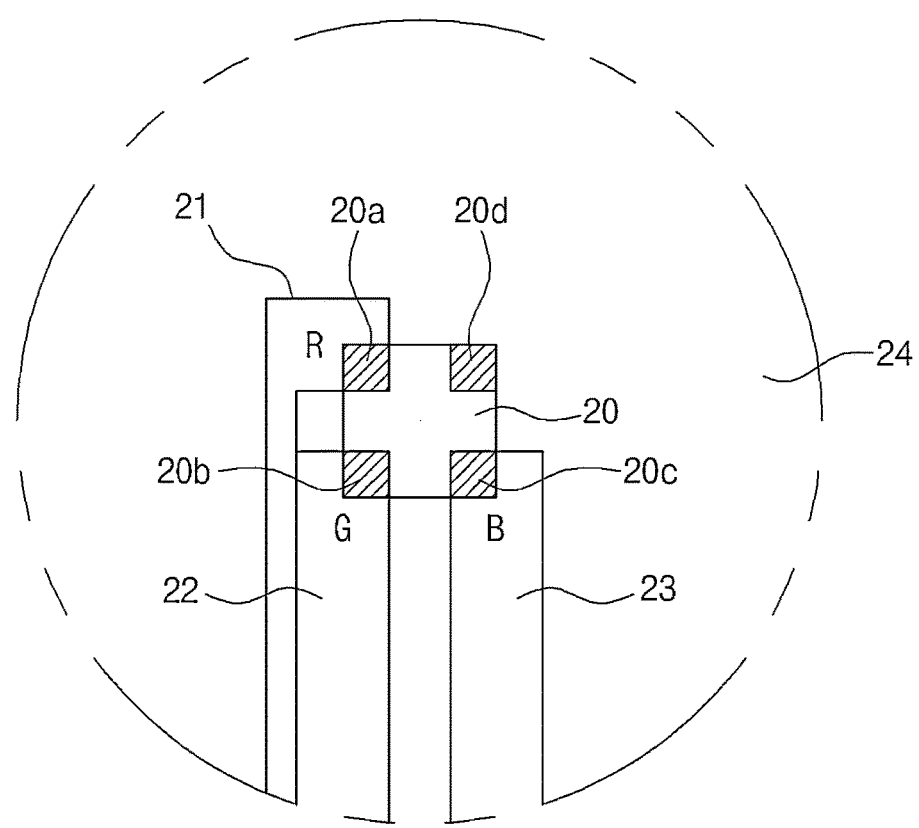

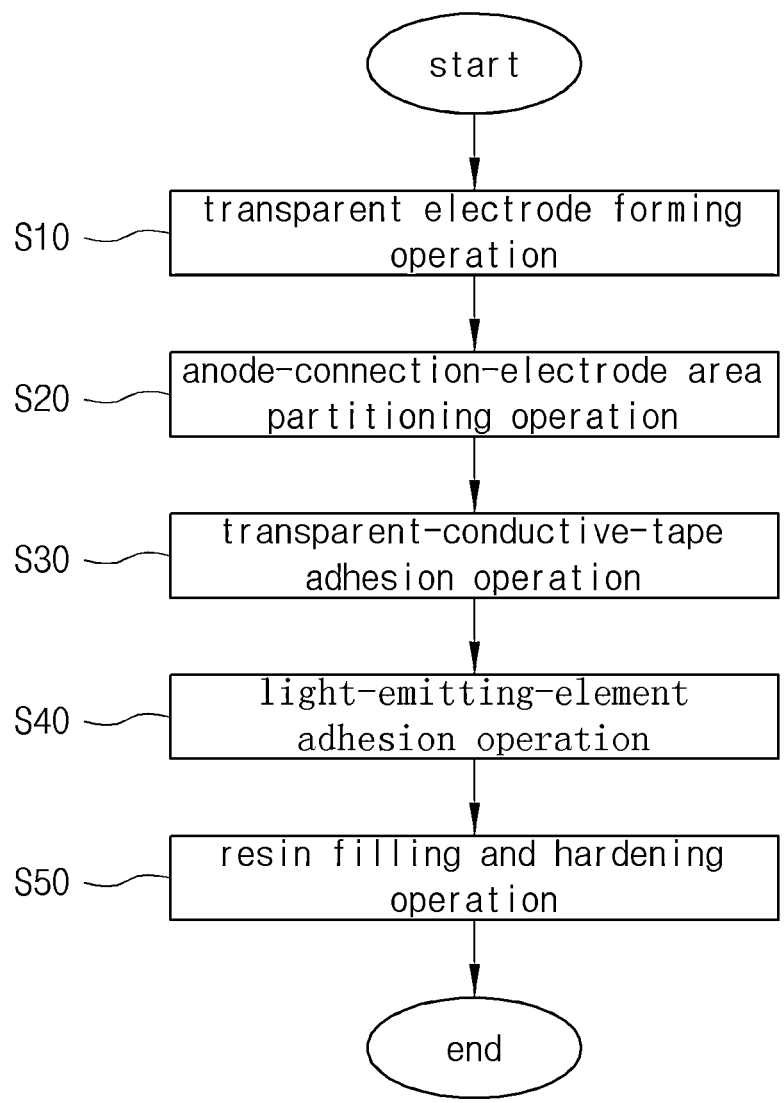

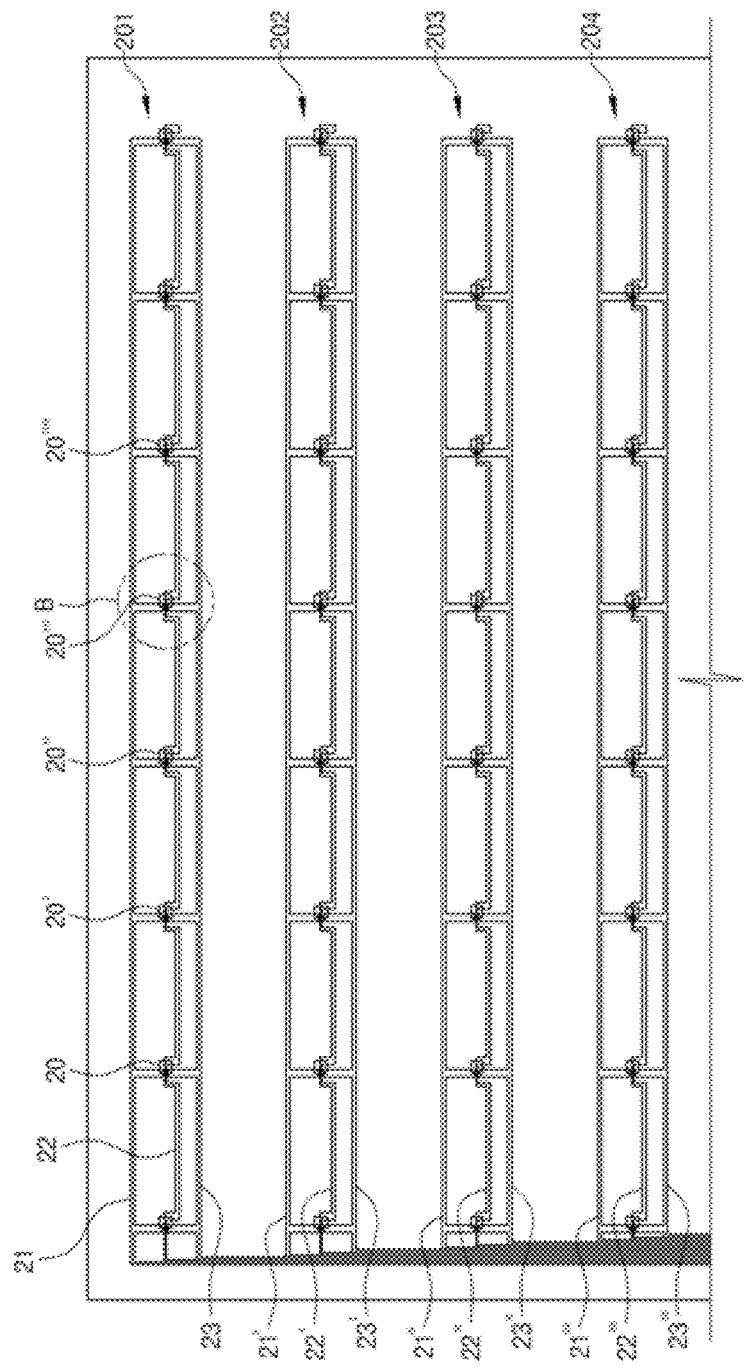

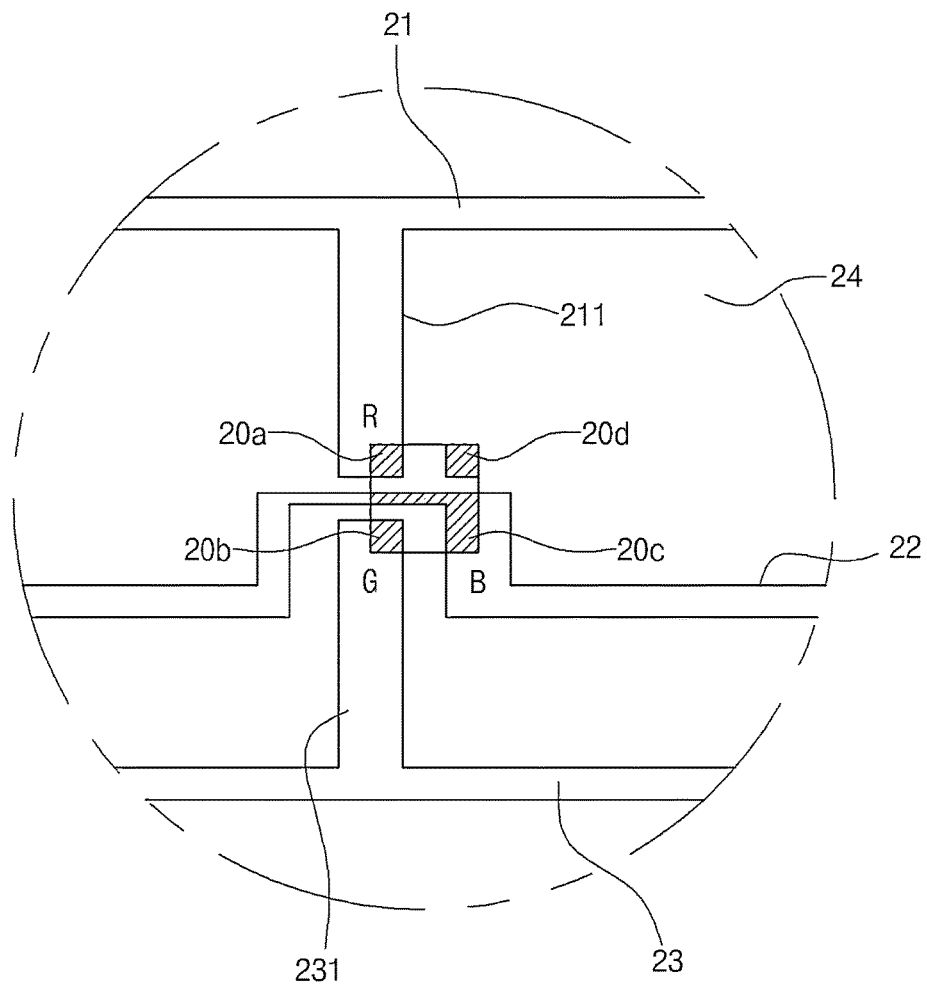

TRANSPARENT ELECTRONIC DISPLAY BOARD AND METHOD FOR MANUFACTURING SAME

CROSS REFERENCE TO RELATED APPLICATIONS AND CLAIM OF PRIORITY

This patent application claims benefit under 35 U.S.C. 119(e), 120, 121, or 365(c), and is a National Stage entry from International Application No. PCT/KR2012/010103, filed 27 Nov. 2012, which claims priority to Korean Patent Application No. 10-2012-0078116, filed 18 Jul. 2012, entire contents of which are incorporated herein by reference.

BACKGROUND

Technical Field

The present invention generally relates to transparent electronic display boards and methods of manufacturing the same. More particularly, the present invention relates to a transparent electronic display board that displays text, images, or videos by means of switching on or off a plurality of light emitting elements installed on transparent electrodes, wherein the transparent electronic display board is configured such that wiring of the light emitting elements is effectively formed, whereby the number of assembly processes and the level of difficulty in manufacture can be reduced, thus improving productivity.

Background Art

Generally, light emitting devices such as neon lamps, cold cathode lamps (CCLs), light emitting diodes (LEDs), etc. are widely used in outdoor electronic display boards. External electrode fluorescent lamps (EEFLs), cold cathode fluorescent lamps (CCFLs), LED electronic displays, etc. are used as indoor light emitting devices.

Neon lamps or CCLs use high voltage power and thus have disadvantages including high power consumption, risk of electric shock or fire, and short lifetimes. On the other hand, EEFLs or CCFLs have problems with being used outdoors because they use high frequency. Furthermore, EEFLs or CCFLs have disadvantages including low intensity of illumination and short lifetimes.

Electronic display boards using LEDs are characterized in that light is emitted in one direction because a rear surface of the board that is opposed to a light emitting surface is covered with a cover for arrangement of wires or black background treatment.

Recently, light emitting devices are used not only as lighting, but also as advertising signboards or interior decorations for beauty.

However, the above-mentioned light emitting devices are limited in enhancing aesthetic effects because of the size of a lamp or the size of a stand for supporting a light emitting device.

To enhance aesthetic effects, transparent electronic display boards were introduced, in which a plurality of light emitting elements provided on transparent electrodes emits light and thus displays text or a figure on the transparent electrode and plays a video using a controller. In such a transparent electronic display board, a plurality of light emitting elements is wired on transparent electrodes. Typically, light emitting elements each having two, three, or four electrodes are used. Of conventional transparent electronic display boards, a wiring diagram of a transparent electronic display board having four-electrode light emitting elements is illustrated in FIG. 1.

FIG. 1 is a wiring diagram showing a conventional transparent electronic display board.

Referring to FIG. 1, the conventional transparent electronic display board includes: a plurality of light emitting elements 1 that is adhered between transparent plates facing each other by transparent resin; transparent electrodes 2a through 2d that are applied to either of transparent plates and are respectively connected to electrodes of the light emitting element to supply power to the light emitting element; and conductive tape 2a' through 2d' supplying power to the transparent electrodes 2a through 2d.

Each light emitting element 1 comprises a four-electrode light emitting element 1. In detail, the light emitting element 1 includes a single cathode electrode and three anode electrodes that are respectively connected to the transparent electrodes 2a through 2d extending from the transparent conductive tapes 2a' through 2d'. The light emitting elements 1 are aligned in rows with respect to the vertical direction. A plurality of rows of light emitting elements 1, in each of which the light emitting elements 1 are aligned with each other in the vertical direction, are provided.

The transparent electrodes 2a through 2d extend from opposite ends of the transparent plate and are respectively connected to the anode electrodes and the cathode electrode of the corresponding four-electrode light emitting element 1. The transparent electrodes 2a through 2d are separated and insulated from each other such that they do not make contact with each other.

Furthermore, the transparent electrodes 2a through 2d are configured such that they successively extended from the opposite ends of the transparent plate to the light emitting elements 1 aligned with each other on the central portion of the transparent plate. That is, the first transparent electrode 2a, which is connected to the cathode electrode to function as a ground terminal, and the second through fourth transparent electrodes 2b through 2d, which are connected to the respective anode electrodes, are successively provided. The fifth through seventh transparent electrodes 2e through 2g connected to the corresponding anode electrodes are successively provided next to the fourth transparent electrodes 2d. Another first transparent electrode connected to the cathode electrodes of other light emitting elements is provided next to the seventh transparent electrode. That is, in the conventional technique, the sixth through eighth transparent electrodes 2f through 2h connected to the anode electrodes are formed.

SUMMARY

However, in the conventional transparent electronic display board, the number of transparent electrodes that are connected to the cathode electrodes of the light emitting elements and function as ground terminals must be changed depending on the number of light emitting elements arranged in the vertical or horizontal direction. Therefore, the number of manufacturing processes becomes comparatively large, whereby production costs are increased, and productivity is reduced.

Accordingly, the present invention has been made keeping in mind the above problems occurring in the prior art, and an object of the present invention is to provide a transparent electronic display board configured such that a transparent electrode for cathode electrodes is connected as a common electrode to cathode electrodes of four-electrode light emitting elements. This reduces the number of processes for connecting the transparent electrode to the light emitting elements, whereby manufacturing times can be reduced, and productivity can be enhanced.

In a transparent electronic display board according to the present invention, a transparent electrode for cathode electrodes is connected in common to cathode electrodes of a plurality of light emitting elements. As such, a design for wiring transparent electrodes connected to the light emitting element can be simplified. Therefore, the number of processes can be reduced, and productivity can be enhanced.

BRIEF DESCRIPTION OF DRAWINGS

FIG. 3 is a view showing the wiring of transparent electrodes in the transparent electronic display board according to the present invention.

FIG. 4 is an enlarged view of FIG. 3.

FIG. 5 is a flowchart showing a method of manufacturing the transparent electronic display board according to the present invention.

FIG. 6 is a view showing another embodiment of the transparent electronic display board according to the present invention.

FIG. 7 is an enlarged view of portion 'B' of FIG. 6.

DETAILED DESCRIPTION

Figure 1:
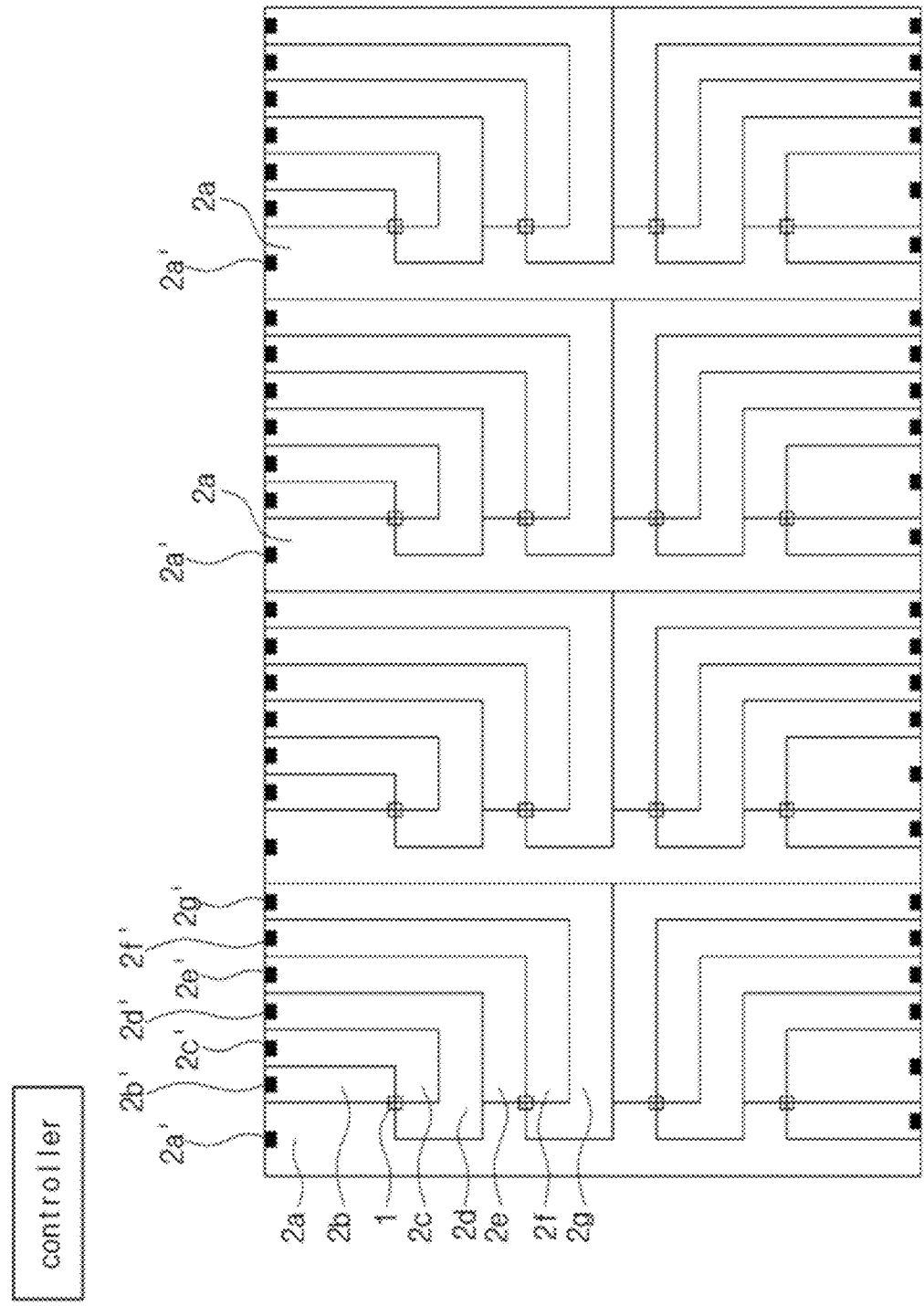
FIG. 1 is a view showing a conventional transparent electronic display board.

In a first embodiment of the present invention, a transparent electronic display board includes: a pair of transparent plates spaced apart from each other and bonded to each other by transparent resin charged into a space between the transparent plates; one or more light emitting elements fastened to any one selected from between the transparent plates; transparent electrodes formed on the selected transparent plate, the transparent electrodes being electrically connected to anode electrodes and cathode electrodes of the light emitting elements; and transparent conductive tape adhered to each of the transparent electrodes on one edge of the transparent plate, the transparent conductive tape supplying power to the corresponding transparent electrode. Each of the light emitting elements includes one or more anode electrodes. The transparent electrodes comprise one or more anode connection electrodes respectively connected to the anode electrodes, and a cathode connection electrode connected in common to the cathode electrodes formed on the respective light emitting elements.

In a second embodiment of the present invention, the cathode connection electrode and the anode connection electrodes may respectively include connection terminals successively extending from on at least one of an upper, lower, left and right edges of the transparent plates, the connection terminals being connected to the corresponding transparent conductive tape. Of the connection terminals, the connection terminal of the cathode connection electrode may be disposed at an uppermost position. The connection terminals of the anode connection electrodes may be successively disposed below the connection terminal of the cathode connection electrode.

In a third embodiment of the present invention, the cathode connection electrode and the anode connection electrodes may respectively include connection terminals successively extending from on at least one of an upper, lower, left and right edges of the transparent plates, the connection terminals being connected to the corresponding transparent conductive tape. Of the connection terminals, the connection terminal of the cathode connection electrode may be disposed at a lowermost position. The connection terminals of the anode connection electrodes may be successively disposed below the connection terminal of the cathode connection electrode.

In a fourth embodiment of the present invention, the anode connection electrodes may be respectively connected to the anode electrodes of each of the light emitting elements. At least one of the anode connection electrodes may be spaced apart from another of the anode connection electrodes by the cathode connection electrode disposed therebetween.

In a fifth embodiment of the present invention, the light emitting elements may form a plurality of light emitting element groups each including one or more light emitting elements arranged in a horizontal direction. The light emitting element groups may be successively arranged in a vertical direction. For each of the light emitting element groups, the number of anode connection electrodes may be equal to the number of anode electrodes of each of the light emitting elements.

In a sixth embodiment of the present invention, each of the anode connection electrodes may include extensions extending in one direction from at least one among an upper portion, a lower portion and a central portion of each of the light emitting element groups including the light emitting elements arranged in one direction, the extensions being connected to the corresponding anode electrodes of the respective light emitting elements.

In a seventh embodiment of the present invention, is a method of manufacturing a transparent electronic display board, including: a transparent electrode forming operation of forming a transparent electrode on an entire area of the transparent plate; an anode-connection-electrode area partitioning operation of separating, from the transparent electrode, areas corresponding to anode connection electrodes connected to anode electrodes of light emitting elements after the transparent electrode forming operation; a transparent-conductive-tape adhesion operation of adhering transparent conductive tape to areas corresponding to the anode connection electrodes after the area partitioning operation; and a light-emitting-element adhesion operation of disposing the light emitting element such that the anode electrodes are aligned with the respective anode connection electrodes and then adhering the light emitting element to the transparent plate In an eighth embodiment of the present invention, the anode-connection-electrode area partitioning operation may include forming the one or more anode connection electrodes corresponding to the number of anode electrodes of each of the light emitting elements. The anode connection electrodes may be disposed at one or more positions among above, below, and on a central portion of the areas on which the light emitting elements are adhered, such that the anode connection electrodes are spaced apart from each other in a vertical direction. The anode connection electrodes may extend in a direction in which the light emitting elements are arranged.

In a ninth embodiment of the present invention, the anode-connection-electrode area partitioning operation may include forming extensions extending from each of the anode connection electrodes toward the areas on which the light emitting elements are adhered. The extensions may be connected to the corresponding anode electrodes of the respective light emitting elements.

MODE FOR INVENTION

Hereinafter, a transparent electronic display board and a method of manufacturing the same according to the present invention will be described in detail with reference to the attached drawings.

Figure 2:
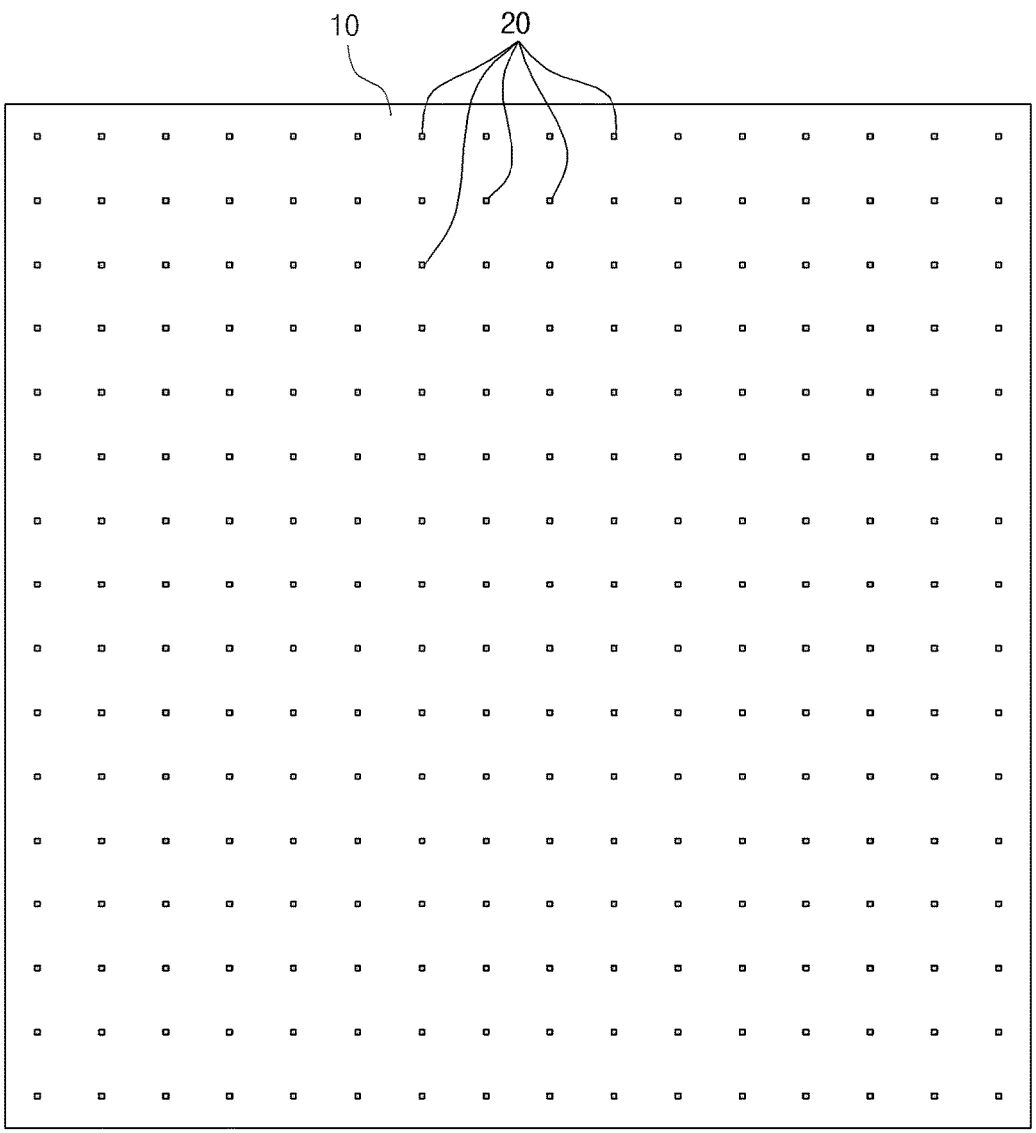
FIG. 2 is a view illustrating a transparent electronic display board according to the present invention.

FIG. 2 is a view illustrating a transparent electronic display board according to the present invention. FIG. 3 is a view showing the wiring of transparent electrodes in the transparent electronic display board according to the present invention. FIG. 4 is an enlarged view of a portion of FIG. 3.

Referring to FIGS. 2 through 4, the transparent electronic display board according to the present invention includes: a pair of transparent plates 10 that are spaced apart from each other by a predetermined distance and are adhered to each other by transparent resin; transparent electrodes 21 through 24 that are made of conductive material and are formed on either of the transparent plates 10 so as to introduce power; a plurality of light emitting elements 20, 20', 20'', and 20''' that are fastened to either of the transparent plates 10 and emit light using power applied from the transparent electrodes 21 through 24; a controller 30 for controlling on or off states of the light emitting elements 20; and transparent conductive tape 25 supplying power to the transparent electrodes 21 through 24.

Facing each other, the two transparent plates 10 are adhered to each other with transparent resin charged into a space between the transparent plates 10. Each transparent plate 10 is made of any one of a transparent glass plate, acrylic glass, and polycarbonate. The combination between the transparent plate 10 and the light emitting elements 20 is a well-known technique; therefore, further explanation and illustration thereof will be omitted.

Each light emitting element 20 is a luminous body turning light on or off depending on the supply of power. The light emitting elements 20 are fastened by conductive resin (not shown) to the transparent electrodes 21, 22, and 23 provided on a surface of either of the two transparent plates 10. A lower end of each light emitting element 20 is fastened to the transparent electrodes 21, 22, and 23. An upper portion of the light emitting element 20 is protected by the transparent resin and is adhered to the other transparent plate. Each light emitting element 20 has anode electrodes 20a through 20c and a cathode electrode 20d. Positive power is input into or output from the anode electrodes 20a, 20b, and 20c. Negative power is input into or output from the cathode electrode 20d. Each light emitting element 20 may comprise any one of a two-electrode light emitting element having one anode electrode and one cathode electrode, a three-electrode light emitting element having two anode electrodes and one cathode electrode, and a four-electrode light emitting element 20 having three anode electrodes and one cathode electrode. In the present invention, a four-electrode light emitting element will be illustrated as one example.

The transparent electrodes 21 through 24 are formed by applying any one of an Indium Tin Oxide (ITO), Indium Zinc Oxide (IZO), and liquid polymer, which are conductive materials, to a surface of a transparent plate that faces another transparent plate. The transparent electrodes 21 through 24 are partitioned and separated from each other such that they are insulated from each other and are respectively connected to the anode electrodes 20a, 20b, and 20c and the cathode electrode 20d of the light emitting element 20. In detail, connected to the anode electrodes 20a, 20b, and 20c of the light emitting element 20, the anode connection electrodes 21 through 23 of the transparent electrodes 21 through 24 extend from one side of the transparent plate 10 of the entire area of the anode connection electrodes 21 through 23 in consideration of the positions of the anode electrodes of the light emitting elements, and are partitioned and separated from each other to form areas that respectively connect to the anode electrodes 20a, 20b, and 20c.

The partitioned transparent electrodes 21 through 24 are respectively connected to the anode electrodes 20a, 20b, and 20c and the cathode electrode 20d of the light emitting element 20. The transparent electrodes 21 through 24 function to transmit control signals from the controller 30 to the light emitting element 20. With regard to the transparent electrodes 21 through 24, areas partitioned to be connected to the anode electrodes 20a, 20b, and 20c of the light emitting element are respectively called the anode connection electrodes 21 through 23, and an area partitioned to be connected to the cathode electrode 20d is called the cathode connection electrode 24.

In detail, the transparent electrodes 21, 22, 23, and 24 comprise a plurality of groups of transparent electrodes 21, 22, 23, and 24. Each group of transparent electrodes 21, 22, 23, 24 includes: one or more anode connection electrodes 21 through 23 that are respectively connected to the one or more anode electrodes 20a, 20b, and 20c formed on the single light emitting element 20; and a cathode connection electrode 24 connected to the cathode electrode 20d.

The number of anode connection electrodes 21 through 23 corresponds to the number of the anode electrodes 20a, 20b, and 20c of each light emitting element 20; however, the single cathode connection electrode 24 is connected in common to the cathode electrodes 20d of a plurality of light emitting elements 20.

For example, for a four-electrode light emitting element 20, the transparent electrodes 21 through 24 comprise a plurality of groups each of which includes a first through third anode connection electrodes 21 through 23 that are respectively connected to a first through third anode electrodes 20a, 20b, and 20c.

A first group of anode connection electrodes 21 through 23 includes: a first anode connection electrode 21 connected to the first anode electrode 20a of the first light emitting element 20; a second anode connection electrode 22 connected to the second anode electrode 20b; and a third anode connection electrode 23 connected to the third anode electrode 20c.

A second group of anode connection electrodes 21', 22', and 23' includes first anode connection electrodes 21' through 23' that are respectively connected to the first through third anode electrodes 20a, 20b, and 20c of the second light emitting element 20. That is, the anode connection electrodes 21 through 23 of the transparent electrodes that form the plurality of groups are respectively connected to the one or more anode electrodes 20a, 20b, and 20c formed on each light emitting element 20.

However, the cathode connection electrode 24 is used in common. In other words, it is connected in common to the cathode electrodes 20d that are formed on the respective light emitting elements 20.

As such, in one embodiment, the present invention is characterized in that the single cathode connection electrode 24 is connected in common to the cathode electrodes 20d of the light emitting elements 20 provided on the transparent electronic display board, and the anode connection electrodes 21 through 23 are respectively connected to the anode electrodes 20a, 20b, and 20c of each light emitting element 20.

The anode connection electrodes 21 through 23 form connection terminals (not designated by reference numerals) that are provided on one edge of the transparent plate 10 and are successively arranged downward from an upper end of the edge. The connection terminals comprise start points from which the anode connection electrodes 21 through 23 extend, and to which the transparent conductive tape 25 is adhered.

In detail, on any one of an upper, lower, left and right edges of the transparent plate 10, the cathode connection electrode 24, connection terminals of the anode connection electrodes 21 through 23 of the first group, connection terminals of the anode connection electrodes 21' through 23' of the second group, and the connection terminals of the anode connection electrodes 21" through 23" of the third group are successively formed from the upper end or one end of the edge of the transparent plate 10. Furthermore, the transparent conductive tape 25 is adhered to each of the connection terminals that are the start points of the anode connection electrodes 21 through 23.

Extending from the connection terminals, the anode connection electrodes 21 through 23 are respectively connected to the anode electrodes 20a, 20b, and 20c of the light emitting elements 20. The cathode connection electrode 24 corresponds to the entire area other than areas on which the anode connection electrodes 21 through 23 are formed.

In one embodiment of the present invention, the transparent electrodes 21 through 24 are formed on the entirety of the transparent plate 10. Thereafter, areas to which the anode connection electrodes 21 through 23 and the light emitting element 20 will be adhered are separated from each other such that they can be insulated from each other. The transparent conductive tape 25 is adhered to each of the areas allocated to the anode connection electrodes 21 through 23 so that electric signals can be transmitted between the controller 30 and the anode connection electrodes 21 through 23.

In addition, the present invention can be modified in a variety of ways as well as the above-mentioned embodiment. Hereinafter, another embodiment of the present invention will be described in detail with reference to FIGS. 5 through 7.

FIG. 5 is a flowchart showing a method of manufacturing the transparent electronic display board according to the present invention.

FIG. 6 is a view showing another embodiment of the transparent electronic display board according to the present invention. FIG. 7 is an enlarged view of portion 'B' of FIG. 6. A light emitting element illustrated in FIGS. 5 through 7 comprises a four-electrode light emitting element including three anode electrodes and a single cathode electrode. The present invention is not limited to this. A two- or three-electrode light emitting element also falls within the technical bounds of the present invention.

Referring to FIGS. 5 through 7, the transparent electronic display board according to this embodiment of the present invention includes: one or more light emitting element groups 201, 202, and 203, each of which includes one or more light emitting element 20, 20', and 20" arranged in the horizontal direction; at least one cathode electrode 20d connected in common to anode electrodes 20a, 20b, and 20c of the light emitting elements 20, 20', and 20" of each light emitting element group 201, 202, 203; and a cathode connection electrode 24 connected in common to the cathode electrodes 20d of the light emitting elements 20, 20', and 20".

In this embodiment, each light emitting element 20, 20', 20" includes one or more anode electrodes 20a, 20b, and 20c and a single cathode electrode 20d. One or more light emitting elements are arranged in the horizontal direction to form a single light emitting element group.

The light emitting element groups 201, 202, and 203 are successively arranged from the upper end of the transparent plate 10 to the lower end thereof.

Each light emitting element group 201, 202, 203 includes one or more light emitting elements 20, 20', and 20" that are arranged in the horizontal direction at positions spaced apart from each other. Each light emitting element 20, 20', 20" may comprise any one of two-, three-, and four-electrode light emitting elements. In this embodiment, a four-electrode light emitting element will be illustrated as one example.

The anode connection electrodes 21, 22, and 23 comprise at least one group of anode connection electrodes. The anode connection electrodes 21, 22, and 23 of each group extend from one side of the transparent plate 10 and are connected to the anode electrodes 20a, 20b, and 20c of the light emitting elements 20, 20', and 20" of the corresponding light emitting element group.

For example, the number of anode connection electrodes 21, 22, and 23 is the same as that of the anode electrodes 20a, 20b, and 20c of each light emitting element 20, 20', 20". Each anode connection electrode 21, 22, 23 is connected in common to the corresponding anode electrodes 20a, 20b, 20c of the light emitting elements of the same light emitting element group. That is, a first group of anode connection electrodes 21, 22, and 23 that is connected to the first light emitting element group includes: a first anode connection electrode 21 that is connected to the first anode electrodes 20a of the light emitting elements of the first light emitting element group 201; a second anode connection electrode 22 that is connected in common to the second anode electrodes 20b of the first light emitting element group 201; and a third anode connection electrode 23 that is connected to the third anode electrodes 20c of the first light emitting element group 201.

The cathode connection electrode 24 is connected in common to the cathode electrodes of all of the light emitting elements 20, 20', and 20" of the first light emitting element group 201 and thus functions as a ground terminal.

The first anode connection electrode 21 is disposed at an upper position of each light emitting element group 201, 202, 203 and extends in the direction in which the light emitting elements 20, 20', 20", and 20''' are arranged. The third anode connection electrode 23 is disposed at a lower position of each light emitting element group 201, 202, 203 and extends in the direction in which the light emitting elements 20, 20', 20", and 20''' are arranged. The second anode connection electrode 22 is disposed between the first anode connection electrode 21 and the third anode connection electrode 23 and extends in the direction of the arrangement of the light emitting element group.

The first anode connection electrode 21 and the third anode connection electrode 23 extend in one direction with a group (for example, 201 of FIG. 6) of light emitting elements 20, 20', 20", and 20''' disposed between the first and third anode connection electrodes 21 and 23. The first anode connection electrode 21 and the third anode connection electrode 23 respectively include a plurality of extensions 211 and a plurality of extensions 231 that are extended toward and connected to the first and third anode electrodes 20a and 20c of the light emitting elements 20, 20', 20", and 20'" of the first light emitting element group 201.

That is, the first anode connection electrode 21 extends in the horizontal direction and includes one or more first extensions 211 that are respectively connected to the first anode electrodes 20a of the light emitting elements 20, 20', 20", and 20'", which are disposed below the first anode connection electrode 21. The third anode connection electrode 23 includes one or more second extensions 231 that are respectively connected to the third anode electrodes 20c of the light emitting elements.

The second anode connection electrode 22 extends from one side of the transparent plate 10 towards the other side and passes through a central portion of an area in which the light emitting element group is disposed. The second anode connection electrode 22 is connected in common to the second anode electrodes 20b of the light emitting elements that belong to each light emitting element group 201, 202, 203.

In the same manner as the preceding embodiment, the first through third anode connection electrodes 21 through 23 are configured such that they are partitioned and insulated from the transparent electrode (cathode connection electrode) 24 applied to the entirety of the transparent plate 10 and have portions that extend depending on the positions of the light emitting elements 20, 20', 20", and 20'". Therefore, it is unnecessary to form a separate cathode connection electrode.

Hereinafter, a method of manufacturing the transparent electronic display board according to the present invention will be described with reference to FIG. 5.

The method of manufacturing the transparent electronic display board according to the present invention includes: a transparent electrode forming operation S10 of forming a transparent electrode on an entire area of the transparent plate 10; an anode-connection-electrode area partitioning operation S20 of separating, from the transparent electrode, areas corresponding to the anode connection electrodes 21, 22, and 23 that are connected to the anode electrodes 20a, 20b, and 20c of the light emitting elements 20 after the transparent electrode forming operation S10; a transparent-conductive-tape adhesion operation S30 of adhering the transparent conductive tape 25 to the anode connection electrodes 21, 22, and 23 after the area partitioning operation S20; a light-emitting-element adhesion operation S40 of disposing the light emitting element 20 such that the anode electrodes 20a, 20b, and 20c correspond to the respective anode connection electrodes 21, 22, and 23 and then adhering the light emitting element 20 to the transparent plate; a resin filling and hardening operation S50 of charging transparent resin into space between the two transparent plates 10 and hardening the transparent resin to bond the transparent plates 10 to each other.

In the transparent electrode forming operation S10, the transparent electrode is formed on the entire area of either of the two transparent plates 10 forming the transparent electronic display board.

In the area partitioning operation S20 of forming areas of the anode connection electrodes 21, 22, and 23, after the transparent electrode forming operation S10, the transparent electrode is partitioned into a plurality of sections so as to form the anode connection electrode sections and areas for bonding the light emitting elements 20 to the transparent plate. Here, each anode connection electrode 21, 22, 23 has a connection terminal on one edge of the transparent plate 10 and is formed by an area extending from the connection terminal to the area for bonding the light emitting element 20. The anode connection electrodes 21, 22, and 23 are formed such that they are insulated from adjacent anode connection electrodes 21', 22', and 23'. The transparent electrode, other than the areas on which the anode connection electrodes 21, 22, and 23 are formed, corresponds to the cathode connection electrode 24.

As such, in the anode-connection-electrode area partitioning operation S20, the connection terminals are successively formed on one edge of the transparent plate 10. For example, like the anode connection electrodes 21, 22, and 23 of the first group that are connected to the anode electrodes 20a, 20b, and 20c of the first light emitting element 20, and like the anode connection electrodes 21', 22', and 23' of the second group that are connected to the second light emitting element 20, the connection terminals of the anode connection electrodes 21, 22, and 23 are successively formed according to the order in which the light emitting elements 20 are positioned. Here, a connection terminal of the transparent electrode (cathode connection electrode) 24 that is first formed is disposed at the uppermost or lowermost end of the edge of the transparent plate 10.

That is, in one embodiment of the present invention, the transparent electrode that is first formed is partitioned into the anode connection electrodes 21, 22, and 23. The area of the transparent electrode other than the anode connection electrodes 21, 22, and 23 forms the cathode connection electrode 24 that is connected to the cathode electrodes 20d of the light emitting elements 20. Therefore, in the present invention, only the anode connection electrodes 21, 22, and 23 are separately formed unlike the conventional technique in which the anode connection electrodes 21, 22, and 23, and the cathode connection electrode must be individually formed through separate processes. Therefore, the present invention can markedly reduce the number of processes and the manufacturing times compared to conventional techniques.

In the transparent-conductive-tape adhesion operation S30, the transparent conductive tape 25 is adhered to start ends of the anode connection electrodes 21, 22, and 23. The transparent conductive tape 25 is electrically connected to the controller 30 and functions to transmit a control signal for the light emitting elements 20 from the controller 30 to the anode connection electrodes.

In the light-emitting-element adhesion operation S40, after the transparent-conductive-tape adhesion operation S30, the ends of the anode connection electrodes 21, 22, and 23 are respectively aligned with the anode electrodes 20a, 20b, and 20c. Thereafter, the light emitting element 20 is adhered to the transparent plate by transparent resin or conductive transparent resin.

In the resin filling and hardening operation S50, after the light-emitting-element adhesion operation S40, the other transparent plate 10 comes into contact with the transparent plate 10 on which the transparent electrode is formed. Subsequently, transparent resin is charged into the space between the transparent plates 10 so that the transparent plates 10 are adhered to each other. The transparent resin is thereafter hardened at room temperature, thus completing the transparent electronic display board.

The transparent electronic display board manufactured through the above-mentioned process does not require a separate transparent electrode connected to the cathode electrode 20d of each light emitting element 20. Therefore, the manufacturing process can be simplified compared to that of conventional techniques.

The above-mentioned manufacturing method pertains to the transparent electronic display board according to the preceding embodiment. Hereinafter, a method of manufacturing the transparent electronic display board according to another embodiment will be explained. Detailed explanation of the same operations as that of the manufacturing method pertaining to the preceding embodiment will be omitted.

In the method of manufacturing the transparent electronic display board according to another embodiment of the present invention, after the transparent electrode forming operation S10, first through third anode connection electrodes 21 through 23 extend from one edge of the transparent plate 10 in the direction in which the elements of each light emitting element group are arranged. Here, the first anode connection electrode 21 and the third anode connection electrode 23 are disposed at the upper and lower positions spaced apart from each other by a predetermined distance. The second anode connection electrode 22 is disposed between the first anode connection electrode 21 and the third anode connection electrode 23.

Areas, on which one or more light emitting element 20, 20', 20", and 20'" spaced apart from each other at regular intervals are placed, are formed between the first anode connection electrode 21 and the third anode connection electrode 23. Furthermore, the first anode connection electrode 21 extends to the areas on which the one or more light emitting elements 20, 20', 20", and 20'" are placed and includes one or more first extensions 211 vertically extending to positions corresponding to the first anode electrodes 20a of the light emitting elements 20, 20', 20", and 20'".

In addition, the third anode connection electrode 23 includes second extensions 231 vertically extending from the respective areas, on which the light emitting elements 20, 20', 20", and 20'" are placed, to positions corresponding to the third anode electrodes 20c of the light emitting elements 20, 20', 20", and 20'".

The second anode connection electrode 22 is disposed between the first extension 211 and the second extension 231 and extends from one side of the transparent plate 10 toward the other side thereof.

In the light-emitting-element adhesion operation S40, the first anode connection electrode 21, the second anode connection electrode 22 and the third anode connection electrode 23 are disposed such that the anode electrodes 20a, 20b, and 20c of each of the light emitting elements 20, 20', 20", and 20'" are connected to the first through third anode connection electrodes 21 through 23. The first through third anode connection electrodes 21 through 23 are thereafter adhered to the transparent plate.

Here, the first anode electrode 20a of the light emitting element 20 is connected to the first extension 211 extending from the first anode connection electrode 21. The second anode electrode 20b is connected to the second anode connection electrode 22. The third anode electrode 20c is connected to the second extension 231 from the third anode connection electrode 23.

Furthermore, the cathode electrodes 20d of the light emitting elements 20, 20', 20", and 20'" are brought into contact with areas of the first-formed transparent electrode 24 other than the first through third anode connection electrodes 21 through 23. Therefore, it is unnecessary to form a separate cathode connection electrode.

As described above, a transparent electrode is formed such that it is connected in common to cathode electrodes of a plurality of light emitting elements. Therefore, wiring for the transparent electrode connected to the light emitting elements can be easily designed. Furthermore, the number of processes can be reduced, and productivity can be enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A transparent electronic display board, comprising:
a pair of transparent plates spaced apart from each other and bonded to each other by transparent resin charged into a space between the transparent plates;
light emitting elements fastened to one of the pair of the transparent plates, each of the light emitting elements comprising a single cathode electrode and anode electrodes comprised of a first anode electrode, a second anode electrode and a third anode electrode, the light emitting elements arranged in horizontal directions and vertical directions;
transparent electrodes formed on said one of the pair of the transparent plates, the transparent electrodes comprising anode connection electrodes connected to the anode electrodes and a single common cathode connection electrode connected in common to all of the cathode electrodes in the transparent electronic display board;
transparent conductive tape adhered to each of the transparent electrodes on one edge of the transparent plate, the transparent conductive tape supplying power to the corresponding transparent electrode, wherein all the transparent conductive tapes to supply the power to the transparent electrodes are positioned on the same edge of the transparent plate;
connection terminals extending from the one edge of the transparent plate, the connection terminals being connected to the corresponding transparent conductive tape;
wherein the anode connection electrodes comprise:
first anode connection electrodes each arranged in each horizontal direction, each first anode connection electrode having a plurality of first extensions each protruding from said each first anode connection electrode in a vertical direction, each first extension connected to each of the first anode electrodes arranged in each horizontal direction;
third anode connection electrodes each arranged in each horizontal direction, each third anode connection electrode having a plurality of second extensions each protruding from said third anode connection electrode in a vertical direction, each second extension connected to each of the third anode electrodes arranged in each horizontal direction, wherein an end-side of the first extension connected to the first anode electrode in each light emitting element is spaced apart from and faces an end-side of the second extension connected to the third anode electrode in said each light emitting element; and
second anode connection electrodes each connected to the second anode electrodes arranged in each horizontal direction, wherein the second anode connection electrode in each horizontal direction is positioned spaced apart from and between the end-sides of the first extensions in said each horizontal direction and the end-sides of the second extensions in said each horizontal direction.

2. The transparent electronic display board of claim 1, wherein the connection terminal of the cathode connection electrode is disposed at an outermost position; and the connection terminals of the anode connection electrodes are successively disposed from the disposed position of the connection terminal of the cathode connection electrode.

3. A method of manufacturing a transparent electronic display board, comprising:
forming a transparent electrode on an entire area of a transparent plate;
partitioning the transparent electrode into areas for anode connection electrodes and an area for a single common cathode connection electrode;
adhering transparent conductive tape to connection terminals positioned at terminals of the anode connection electrodes after the area partitioning operation, wherein all the transparent conductive tapes are positioned on the same edge of the transparent plate; and
disposing light emitting elements arranged in columns and rows such that anode electrodes for the light emitting elements are aligned with the anode connection electrodes, and all of the cathode electrodes for the light emitting elements in transparent electronic display board is aligned with the single cathode connection electrode, and then adhering the light emitting elements to the transparent plate, wherein the single cathode connection electrode is connected in common to all of the cathode electrodes in the transparent electronic display board,
wherein the anode connection electrodes comprise:
first anode connection electrodes each arranged in each row, each first anode connection electrode having a plurality of first extensions each protruding from said each first anode connection electrode in a vertical direction, each first extension connected to each of the first anode electrodes arranged in each row;
third anode connection electrodes each arranged in each row, each third anode connection electrode having a plurality of second extensions each protruding from said third anode connection electrode in a vertical direction, each second extension connected to each of the third anode electrodes arranged in each row, wherein an end-side of the first extension connected to the first anode electrode in each light emitting element is spaced apart from and faces an end-side of the second extension connected to the third anode electrode in said each light emitting element; and
second anode connection electrodes each connected to the second anode electrodes arranged in each row, wherein the second anode connection electrode in each row is positioned between the end-sides of the first extensions in the corresponding row and the end-sides of the second extensions in the corresponding row.

4. The method of claim 3, wherein the area partitioning comprises
forming the first and second extensions protruding from each of the first and third anode connection electrodes toward the areas on which the light emitting elements are adhered, the extensions being connected to the corresponding anode electrodes of the respective light emitting elements.

5. A transparent electronic display board, comprising:
a pair of transparent plates spaced apart from each other and bonded to each other by transparent resin charged into a space between the transparent plates;
light emitting elements fastened to one of the pair of the transparent plates, the light emitting elements arranged in rows comprised of a first row, a second row and a third row, and columns comprised of a first column, a second column, and a third column, the light comprising a first light emitting element, a second light emitting element arranged in, a third lighting element, a fourth lighting element, a fifth lighting element, a sixth lighting element, a seventh lighting element, an eighth lighting element, and a ninth lighting element,
wherein the first to three lighting elements are arranged in the first row, the fourth to sixth lighting elements are arranged in the second row, and the seventh to ninth lighting elements are arranged in the third row;
the first, fourth and seventh lighting elements are arranged in the first column, the second, fifth and eighth lighting elements are arranged in the second column, and the third, sixth and ninth lighting elements are arranged in the third column;
each of the lighting elements comprising a first anode electrode, a second anode electrode and a third anode electrode, and a single cathode electrode;
transparent electrodes formed on said one of the pair of the transparent plates, the transparent electrodes comprising:
a first anode connection electrode connected in common to the first anode electrodes of the first to three light emitting elements arranged in the first row, the first anode connection electrode having a first extension protruding vertically from the first anode connection electrode and connected to the first anode electrode of the first light emitting element, a second extension protruding vertically from the first anode connection electrode connected to the first anode electrode of the second light emitting element, and a third extension protruding vertically from the first anode connection electrode connected to the first anode electrode of the third light emitting element;
a second anode connection electrode connected in common to the second anode electrodes of the first to three light emitting elements arranged in the first row;
a third anode connection electrode connected in common to the third anode electrodes of the first to third light emitting elements arranged in the first row, the third anode connection electrode having a fourth extension protruding vertically from the third anode connection electrode connected to the third anode electrode of the first light emitting element, a fifth extension protruding vertically from the third anode connection electrode connected to the third anode electrode of the second light emitting element, and a sixth extension protruding vertically from the third anode connection electrode connected to the third anode electrode of the ninth third light emitting element; and
a single common cathode connection in common to all of the cathode electrodes of the first to ninth light emitting elements;
transparent conductive tape adhered to each of the transparent electrodes on one edge of the transparent plate, the transparent conductive tapes supplying power to the transparent electrodes, wherein all the transparent conductive tapes to supply the power to the transparent electrodes are positioned on the same edge of the transparent plate; and connection terminals extending from the one edge of the transparent plate, the connection terminals each connected to the corresponding transparent conductive tape.

* * * * *